United States Patent [19]

Hagino

[11] Patent Number: 4,662,957
[45] Date of Patent: May 5, 1987

[54] METHOD OF PRODUCING A GATE TURN-OFF THYRISTOR

[75] Inventor: Hiroyasu Hagino, Nishinomiya, Japan

[73] Assignee: Mitsubishi Denki Kabushiki Kaisha, Tokyo, Japan

[21] Appl. No.: 725,632

[22] Filed: Apr. 22, 1985

[30] Foreign Application Priority Data

Apr. 27, 1984 [JP] Japan .................... 59-86830

[51] Int. Cl.$^4$ .......................................... H01L 21/385
[52] U.S. Cl. .................................. 148/188; 148/186; 148/187; 357/38
[58] Field of Search ............... 148/188, 186, 187; 357/38

[56] References Cited

U.S. PATENT DOCUMENTS

| | | | |
|---|---|---|---|
| 3,303,360 | 2/1967 | Gentry | 357/86 X |
| 3,342,651 | 9/1967 | Raithel | 148/DIG. 62 |
| 3,356,543 | 12/1967 | Desmond et al. | 148/186 |
| 3,442,722 | 5/1969 | Bauerlein et al. | 148/DIG. 62 |
| 3,860,947 | 1/1975 | Gamo et al. | 148/190 X |
| 3,941,625 | 3/1976 | Kennedy et al. | 148/187 |
| 4,450,467 | 5/1984 | Nagano et al. | 357/38 |
| 4,574,296 | 3/1986 | Sueoka et al. | 357/38 |

FOREIGN PATENT DOCUMENTS

148086 11/1975 Japan .

Primary Examiner—George T. Ozaki
Attorney, Agent, or Firm—Birch, Stewart, Kolasch and Birch

[57] ABSTRACT

A method of producing a gate turn-off thyristor includes producing a first n type impurity region, a second p type impurity region, a third n type impurity region, and a fourth p type impurity region produced in a semiconductor substrate providing a cathode electrode in contact with the first n type impurity region, providing a gate electrode in contact with the second p type impurity region, and an anode electrode which short-circuits the third and the fourth regions at the second main surface of the semiconductor substrate. Gold is diffused into the third region at a predetermined diffusion temperature thereby shortening the life time of carriers in the substrate.

4 Claims, 4 Drawing Figures

METHOD OF PRODUCING A GATE TURN-OFF THYRISTOR

FIELD OF THE INVENTION

The present invention relates to a method of producing a gate turn-off thyristor (hereinafter referred to as "GTO"), especially to that of producing a GTO of high power and a high blocking voltage.

BACKGROUND OF THE INVENTION

Conventionally, an element of an anode short-circuit structure shown in FIG. 1 is used as a high power GTO having a low on-state voltage. The reference numeral 1 designates an n type base region comprising an n type silicon substrate. There is produced a p type base region 2 on the n type base region 1. The reference numeral 3 designates p type emitter regions which are produced on the surface region of the n type base region 1. The numeral 4 designates n type emitter regions produced at the surface region of the p type base region 2. The reference numeral 5 designates an anode electrode provided in ohmic contact with the p type emitter region 3. The numeral 6 designates a gate electrode provided in ohmic contact with the p type base region 2. The numeral 7 designates a cathode electrode provided in ohmic contact with the n type emitter region 4. Herein, the anode electrode 5 short-circuits the n type base region 1 and the p type emitter region 3.

In GTOs having such an anode short-circuited structure, the remaining carriers inside the n type base region 1 are extracted through the anode short-circuited portion in turn-off operation, thereby making it unnecessary to shorten the carrier life time of the n type base region 1. As a result, it is possible to realize a low on-state voltage in such an anode short-circited structure GTO relative to the usual GTOs.

In high voltage resistivity GTOs, however, it is necessary to design the n type base region 1 to have a large thickness in view of blocking voltage, and consequently, it is required to shorten the carrier life time even in the anode short-circuited structure. This is because, if the carrier life time of the n type base region 1 is too long, the tail current during the gate turn-off operation becomes long, resulting in an increased turn-off loss and an increased minimum turn off time. These make high frequency operation of the GTO difficult.

Another prior art is disclosed in the U.S. Pat. No. 3,303,360. The semiconductor switch of this patent adopts an anode short-circuited structure aiming at improving the turn-off characteristic thereof.

Another prior art is disclosed in Japanese Laid-Open patent specification No. 58-148086. The thyristor of this laid-open patent specification has an anode short-circuited structure in which a short-circuited emitter with provided directly below the n type emitter. This structure improves the turn-off characteristic without increasing the on-state voltage $V_{TM}$.

OBJECTS AND SUMMARY OF THE INVENTION

The present invention is directed to solve the problems pointed out above, and has for its object to provide a method of producing a GTO capable of improving the turn-off characteristic without sacrificing the turn-on characteristic.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a method of producing a gate turn-off thyristor comprising a first n type impurity region, a second p type impurity region, a third n type impurity region, and a fourth p type impurity region produced in a semiconductor substrate in the above-mentioned order from the side of the first main surface of the semiconductor substrate, a cathode electrode provided in contact with the first n type impurity region, a gate electrode provided in contact with the second p type impurity region, and an anode electrode which short-circuits the third and the fourth regions at the second main surface of the semiconductor substrate, which method is characterized in that gold is diffused to the third region at a predetermined diffusion temperature thereby to shorten the life time of carriers in the third region.

DETAILED DESCRIPTION OF THE PREFERRED EMBODIMENTS

Figure 1:
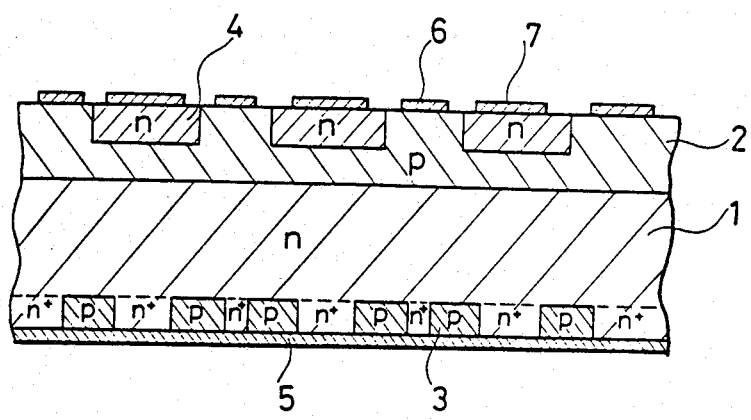
FIG. 1 is a cross-sectional view showing a GTO wafer of a prior art GTO.
Figure 2:
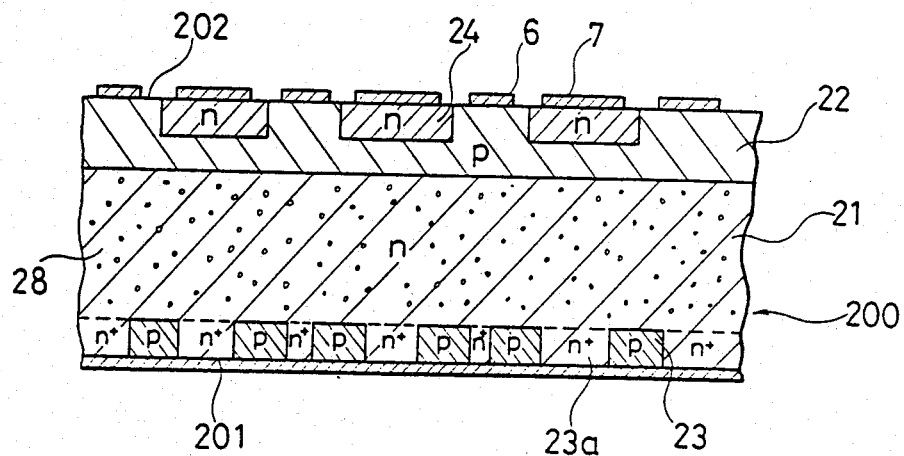
FIG. 2 is a cross-sectional view showing a GTO wafer of one embodiment of the present invention.

A method of producing a GTO as one embodiment of the present invention will be described in detail with reference to FIG. 2 which shows a cross-section of the GTO.

At first, p type regions (one is designated by 22) are produced at the both surfaces of the n type silicon substrate 21 by diffusing p type impurities such as gallium or aluminum. Thereafter, the p type region at the opposite side of the p type region 22 is removed by lapping or the like to produce a silicon wafer 200 comprising the n type silicon substrate 21 and the p type region 22, and a predetermined pattern is produced at the surface (the anode surface 201) to which the lapping is conducted. Thereafter, p type impurities such as boron are diffused to produce p type emitter regions 23. Hereupon, in producing the p type emitter regions 23, the following steps can be conducted; that is, n+ regions 23a at the anode short-circuited portion are selectively produced, and p type impurities such as gallium are diffused to the whole surface thereof, thereby producing the p type emitter regions 23. In this case it is necessary that the density of the n type impurities in the n+ regions 23a are sufficiently higher than that of the p type impurities in the p type emitter regions 23. Thereafter, an anode electrode 5 is produced at the anode surface 201 of the silicon wafer 200.

Thereafter, n type emitter regions 24 are produced at the predetermined positions of the counter side surface (cathode surface 202) of the lapped surface (anode surface 201) by diffusion of n type impurities.

Thereafter, gold 28 impurities are doped to the element by diffusion method, thereby shortening the carrier life time of the n type base region 21. This gold doping is conducted in such a manner that after the insulating film at the anode surface 201 of the silicon wafer 200 to which the diffusion of n type impurities is conducted is completely removed by hydrofluoric acid or the like, gold is attached to the anode surface 201 by deposition or the like, and a diffusion of the gold is conducted to the silicon wafer 200 in a diffusion hearth. The quantity of the gold doping is determined by the diffusion time and the diffusion temperature, and it can be controlled by changing the diffusion temperature during intervals of 25 to 30 minutes.

In this way, a GTO comprising a first n type impurity region 24, a second p type impurity region 22, a third n type impurity region 21, and a fourth p type impurity region 23 produced in a semiconductor substrate 200 in the above-mentioned order from the side of the first main surface of the semiconductor substrate, a cathode electrode 7 provided in contact with the first n type impurity region 24, a gate electrode 6 provided in contact with the second p type impurity region 22, and an anode electrode 5 which short-circuits the third region 21 and the fourth region 23 at the second main surface thereof.

Figure 3:
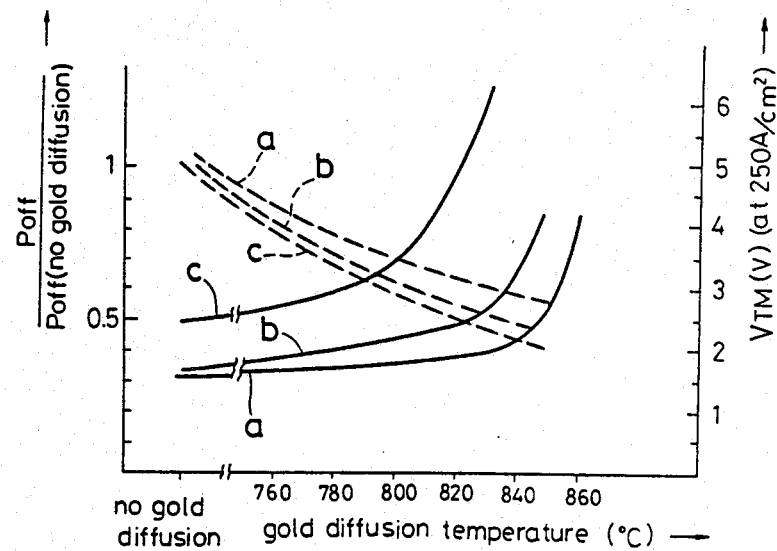
FIG. 3 is a graph showing the characteristics between the turn-on loss Poff or the ON-voltage $V_{TM}$ and the gold diffusion temperature.

The curve a in FIG. 3 shows the characteritic between the turn-off loss [Poff] (in broken lines) or the ON voltage $V_{TM}$ (in real lines), and gold diffusion temperature in GTOs having blocking voltage of 1000 to 2000 volts. In GTOs having blocking voltage of 1000 to 2000 volts, the resistivity of the silicon substrate is usually set to about 50 to 100 Ω.cm, and the thickness of the n type base layer is usually set to about 250 to 300 μm in GTOs having a cut-off current above several hundreds amperes, varying depending on the cut-off current. In the Figure, it is shown that the on-state voltage $V_{TM}$ increases rapidly from about 845 C of gold diffusion temperature. On the other hand, the turn-off loss [Poff] decreases with the rising of the gold diffusion temperature. Considering both characteristics, in GTOs having a blocking voltage of 1000 to 2000 volts, it is possible to imporve the correlation between the turn-off loss [Poff] and the on-state voltage $V_{TM}$ by diffusing gold at the diffusion temperature of 820° to 845° C., thereby resulting in a reduced turn-off loss [Poff] without increasing the on-state voltage $V_{TM}$.

The curve b in FIG. 3 shows the characteristic between the [Poff] or the $V_{TM}$, and the gold diffusion temperature in GTOs having a blocking voltage of 2000 to 3000 volts. In GTOs having the blocking voltage of 2000 to 3000 volts, a silicon substrate which has a resistivity of 100 to 160 Ω.cm is usually used, and the thickness of the n type base layer is usually set to about 350 to 450 μm in GTOs having a cut-off current above several hundreds of amperes, varying depending on the cut-off current. In this case, the $V_{TM}$ increases rapidly at about 830° C. of gold diffusion temperature. Accordingly, in GTOs having the blocking voltage of 2000 to 3000 volt, it is most preferable to conduct a gold diffusion at a temperature of 800° to 830° C.

The curve c in FIG. 3 shows the characteristic between the [Poff] or the $V_{TM}$, and the gold diffusion temperature in GTOs having the blocking voltage of 3000 to 5000 volts. In GTOs having a blocking voltage of 3000 to 5000 volts, a silicon substrate which has resistivity of 160 to 250 Ω.cm is usually used, and the thickness of the n type base layer is set to about 450 to 600 μm in GTOs having a cut-off current above several hundreds of amperes, varying depending upon the cut-off current. In this case, the $V_{TM}$ rapidly increases at about 810° C. of the gold diffusion temperature. Accordingly, in GTOs having the blocking voltage of 3000 to 5000 volts, it is most preferable to conduct a gold diffusion at a temperatutre of 760° to 810° C.

Besides, there is a relationship represented by the following formula among the three parameters of the width of the n type base region WnB, the gold diffusion temperature T, and the on-state voltage $V_{TM}$:

$$V_{TM} = \frac{KT}{q} \ln \frac{I}{Iso} + \frac{KT}{q} \left( \delta \cdot e^{\frac{WnB}{2L}} + IR\kappa \right) \quad (1)$$

$$L = D\tau p$$

$$\tau p = \frac{1}{\alpha p N A u}$$

where,
L: diffusion length
D: diffusion coefficient
τp: life time
αp: trap probability of holes
I: current
Iso: leak current
Nau: concentration of gold The concentration of gold Nau is decided by the gold diffusion temperature T, but there is no general formula which represents the relation therebetween. On the other hand, there are relations between the blocking voltage V and the width of the vacant layer χm, and between the width χm and the width of the n type base layer WnB represented by the following formulae, respectively:

$$\chi m = \sqrt{\frac{2k\epsilon oV}{qN_D}} \quad (2)$$

$$WnB = \chi m + \alpha \quad (3)$$

Where, the α is a margin which is set to about 100 nm in a usual design.

The resistivity τ

$$\rho = \frac{1}{q\mu(N_D - N_a)}$$

is decided by the required blocking voltage V, where $N_d$, Na are concentrations of donors and acceptors, respectively.

Figure 4:
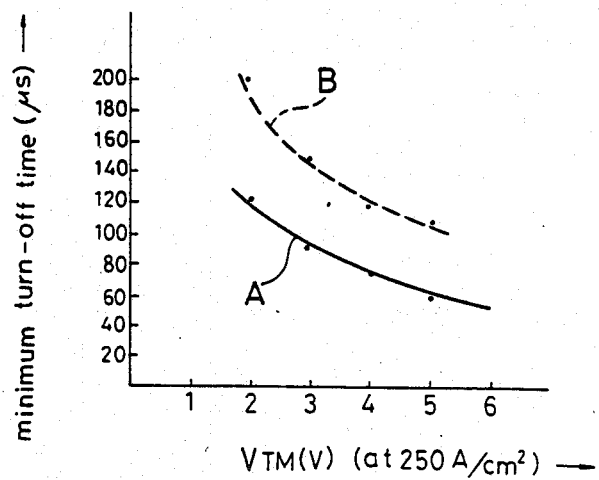
FIG. 4 is a graph showing the characteristics between the on-state-voltage $V_{TM}$ and the minimum turn-off time.

FIG. 4 shows the characteristic between the minimum turn-off time and the $V_{TM}$ in a GTO having the anode short-circuited structure, and that in a general reverse blocking GTO both having the blocking voltage of 3000 to 5000 volts. The curve A shows a characteristic in a GTO obtained by diffusing gold into a GTO having the anode short-circuited structure to control the life time of the base region. The curve B shows a characteristic in a reverse blocking GTO. As apparent from the curve A, the GTO of this embodiment has a quite shortened minimum turn-off time, that is, the minimum time period from the input of the gate-off signal to a time when the next ON signal is allowed to be input in a condition of the same on state voltage $V_{TM}$. This means that the GTO having the anode short-circuited structure produced by the gold diffusion has an advantage of being suitable for a high frequency operation.

As apparent from the foregoing, according to the present invention, the life time of the n type base region is shortened by a gold diffusion conducted at a predetermined temperature. This results in a reduced turn-off loss without increasing the ON voltage $V_{TM}$, and furthermore, an enhancement of the turn-off characteristic.

What is claimed is:

1. A method of producing a gate turn-off thyristor, comprising the steps of:
   forming a first p type impurity region on a top surface of an n type semiconductor substrate;
   forming a plurality of second n type impurity regions in said first p type impurity region;
   selectively forming a plurality of third n type impurity regions on a bottom surface of said semiconductor substrate;
   forming a plurality of fourth p type impurity regions of said bottom surface on those areas in which said third n type impurity regions are not present;
   providing a cathode electrode in contact with each of said second n type impurity regions
   providing a gate electrode in contact with said first p type impurity region; and
   providing an anode electrode which short-circuits the third and the fourth regions at said bottom surface of the semiconductor substrate, wherein gold is diffused through said third n type regions into said semiconductor substrate at a predetermined diffusion temperature, thereby shortening the life time of carriers present in said substrate.

2. A method of producing a gate turn-off thyristor as defined in claim 1, wherein the diffusion temperature is set at 820° C. to 845° C. when producing a gate turn-off thyristor, having a blocking voltage of 1000 to 2000 volts.

3. A method of producing a gate turn-off thyristor as defined in claim 1, wherein the diffusion temperature is set at 800° to 830° C. when producing a gate turn-off thyristor having a blocking voltage of 2000 to 3000 volts.

4. A method of producing a gate turn-off thyristor as defined in claim 1, wherein the diffusion temperature is set at 760° to 810° C. when producing a gate turn off thyristor having a blocking voltage of 3000 to 5000 volts.

* * * * *